United States Patent
Narsale et al.

(10) Patent No.: US 10,599,575 B2
(45) Date of Patent: Mar. 24, 2020

(54) MEDIA MANAGER CACHE WITH INTEGRATED DRIFT BUFFER

(71) Applicant: Micron Technology, Inc., Boise, ID (US)

(72) Inventors: Ashay Narsale, Newark, CA (US); Robert M. Walker, Raleigh, NC (US)

(73) Assignee: MICRON TECHNOLOGY, INC., Boise, ID (US)

(*) Notice: Subject to any disclaimer, the term of this patent is extended or adjusted under 35 U.S.C. 154(b) by 8 days.

(21) Appl. No.: 16/100,074

(22) Filed: Aug. 9, 2018

(65) Prior Publication Data

US 2020/0050549 A1 Feb. 13, 2020

(51) Int. Cl.
| | |
|---|---|
| G06F 11/00 | (2006.01) |
| G06F 11/30 | (2006.01) |
| G08C 25/00 | (2006.01) |
| H03M 13/00 | (2006.01) |
| H04L 1/00 | (2006.01) |
| G06F 12/0868 | (2016.01) |
| G11C 29/52 | (2006.01) |
| G11C 11/56 | (2006.01) |

(52) U.S. Cl.
CPC ...... *G06F 12/0868* (2013.01); *G11C 11/5678* (2013.01); *G11C 29/52* (2013.01); *G06F 2212/7209* (2013.01); *G11C 2211/5641* (2013.01)

(58) Field of Classification Search
CPC . G06F 12/0868; G11C 29/52; G11C 11/5678; G11C 2211/5641
See application file for complete search history.

(56) References Cited

U.S. PATENT DOCUMENTS

| | | | | |
|---|---|---|---|---|
| 2014/0006696 | A1* | 1/2014 | Ramanujan | G11C 13/0004 711/103 |
| 2014/0226413 | A1* | 8/2014 | Gomez | G11C 16/3454 365/185.22 |

OTHER PUBLICATIONS

Non-Final Office Action from U.S. Appl. No. 16/056,354, dated May 21, 2019, 7 pages.

* cited by examiner

*Primary Examiner* — Samir W Rizk
(74) *Attorney, Agent, or Firm* — Nicholson de vos Webster & Elliott LLP

(57) ABSTRACT

A method to cache memory requests while accounting for phase change memory cell drift is described. The method includes adding, in response to receiving a write memory request from a host system, an entry to a cache that includes user data of the write memory request, wherein the write memory request is directed to a set of phase change memory cells; adding, in response to receiving the write memory request, an entry in a first content-addressable memory (CAM), wherein the entry in the first CAM includes a reference to the entry in the cache that includes the user data of the write memory request; writing the user data of the write memory request to the set of phase change memory cells; and adding an entry to a second CAM, wherein the entry in the second CAM includes a reference to the entry in the cache that includes the user data.

20 Claims, 9 Drawing Sheets

| DRIFT CAM 204A | | |
|---|---|---|
| ADDRESS 504₁ | VALIDITY BIT 506₁ | POINTER 508₁ |
| ADDRESS 504₂ | VALIDITY BIT 506₂ | POINTER 508₂ |
| ADDRESS 504₃ | VALIDITY BIT 506₃ | POINTER 508₃ |
| ... | ... | ... |
| ADDRESS 504_Q | VALIDITY BIT 506_Q | POINTER 508_Q |

(rows labeled 502₁, 502₂, 502₃, ... 502_Q)

FIG. 5

MEDIA MANAGER CACHE WITH INTEGRATED DRIFT BUFFER

TECHNICAL FIELD

The various embodiments described in this document relate to managing memory components. In particular, embodiments include systems and methods for integrating a drift buffer into a media manager cache.

BACKGROUND ART

Research and development of commercially viable memory devices that are randomly accessed, have relatively low power consumption, and are non-volatile is ongoing. One ongoing area of research is in resistive memory cells where resistance states can be changed. One avenue of research relates to devices that store data in memory cells by structurally or chemically changing a physical property of the memory cells in response to applied write voltages and/or current, which in turn changes cell resistance. A controller uses a voltage read reference to detect the resistivity. An example of a variable resistance memory device includes memories using phase changing glasses (e.g., chalcogenide glass). The change in physical property, or phase change, is a transition and, within a population of phase change cells, there exists a distribution of transition latencies. The tails/ends of this distribution is problematic as a clear set of read/demarcation voltages can be difficult to ascertain. Further, delaying accesses to accommodate the tails/ends of the distribution erodes the value of phase change memory (i.e., read times can be lengthened).

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 5 shows an example of the drift CAM, in accordance with some embodiments of the present disclosure.

DETAILED DESCRIPTION

Figure 1:
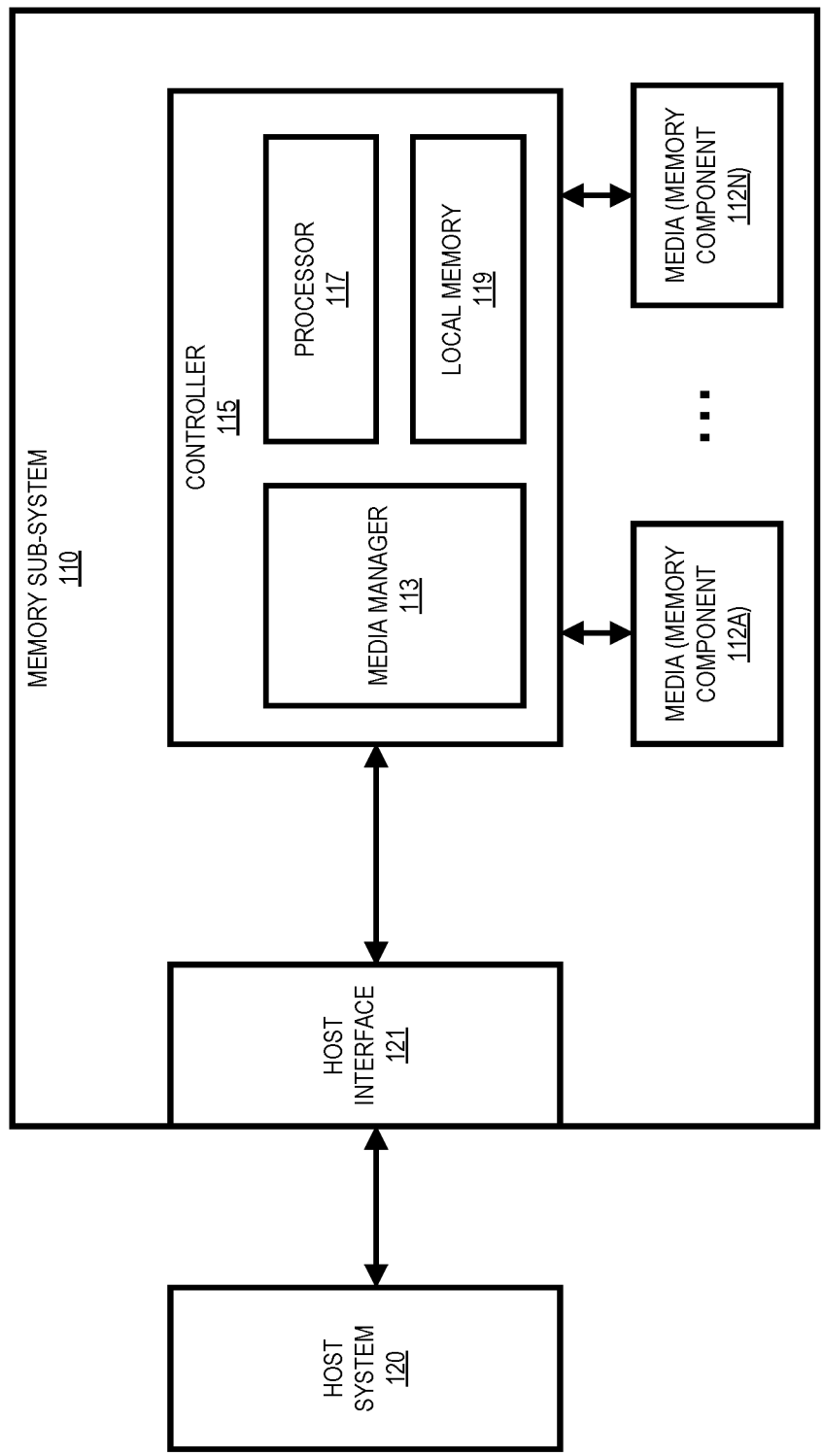
FIG. 1 illustrates an example computing environment that includes a memory sub-system, in accordance with some embodiments of the present disclosure.

Aspects of the present disclosure are directed to a drift buffer in a memory sub-system. A memory sub-system is also hereinafter referred to as a "memory device". An example of a memory sub-system is a storage system, such as a solid-state drive (SSD). In some embodiments, the memory sub-system is a hybrid memory/storage sub-system. In general, a host system can utilize a memory sub-system that includes one or more memory devices, including those that utilize phase change memory cells with variable resistance materials. The host system can provide data to be stored at the memory sub-system and can request data to be retrieved from the memory sub-system.

Although variable resistance materials of phase change memory cells are conventionally described as being in one phase or another (e.g., metastable in an amorphous phase or a crystalline phase) and having a discrete resistivity while in that corresponding phase, resistivity of variable resistance materials can in actuality be in constant transition or can be constantly drifting. Namely, the resistivity of variable resistance materials can vary (i.e., decelerate) over time as the material attempts to settle. Further, the rate of resistivity change can be dependent on the phase of the variable resistance material. For example, when a variable resistance material is in a crystalline phase (i.e., is set) the rate of resistivity change can be higher than when the variable resistance material is in the amorphous phase (i.e., is reset/unset).

Based on inconsistencies in the changing resistivity of variable resistance materials when in the amorphous and crystalline phases, determining a demarcation voltage for reading the variable resistance material is difficult and can be prone to error. This issue is particularly prevalent just after a variable resistance material has been written (e.g., zero to one-hundred milliseconds after the phase of the variable resistance material has been altered) as the resistivity of the variable resistance material is at its highest level of transition/drift. As time elapses from the time the phase change memory cell was written, using a defined demarcation voltage is less prone to producing a read error.

To address the above issues, a set of data structures (e.g., within media manager volatile memory), can be used for temporarily storing user data that was recently written to variable resistance materials of phase change memory cells and/or parity bits associated with the user data. Accordingly, when a read memory request is received by a memory controller corresponding to recently written variable resistance materials, data can be read from the set of data structures rather than from the variable resistance materials. In some embodiments, two separate memory structures are managed by a memory controller to address resistivity drift: (1) a media manager cache that stores recent write and read memory requests, including associated user data (e.g., requests to read user data from or write user data to memory devices, including those that are implemented with phase change memory cells) and (2) a drift buffer that stores user data that was recently written to phase change memory cells. This architecture results in considerable overhead costs. For example, this overhead includes (1) space devoted to two separate memory structures (e.g., a media manager cache and a drift buffer) and (2) management of the two separate memory structures (e.g., movement of user data between the media manager cache and the drift buffer upon eviction from the media manager cache).

To reduce the overhead costs of the above described architecture, the drift buffer can be eliminated in favor of the use of pointers/references in a separate drift data structure (e.g., a drift content-addressable memory (CAM)) to portions on the media manager cache. In particular, as will be described in greater detail below, as dirty entries are evicted from a media manager cache CAM, which manages/catalogs the media manager cache (e.g., write requests/instructions that have not yet been committed to phase change memory cells), corresponding entries can be added to a drift CAM together with the corresponding user data being written to the phase change memory cells. The entries in the drift CAM reference user data in the media manager cache. Accordingly, instead of moving and writing user data to a drift buffer as performed in a conventional architecture, the user data remains in the media manager cache and the drift CAM includes a pointer/reference to the location of the user data in the media manager cache. In this fashion, additional movement/writes of the user data can be avoided in addition to the elimination of a separate memory structure (e.g., the elimination of the drift buffer). Several details of this architecture will now be described below by way of example.

FIG. 1 illustrates an example computing environment 100 that includes a memory sub-system 110 in accordance with some embodiments of the present disclosure. The memory sub-system 110 can include media, such as memory components 112A to 112N. The memory components 112A to 112N can be volatile memory components, non-volatile memory components, or a combination of such. In some embodiments, the memory sub-system is a storage system. An example of a storage system is a solid-state drive (SSD). In some embodiments, the memory sub-system 110 is a hybrid memory/storage sub-system. In general, the computing environment 100 can include a host system 120 that uses the memory sub-system 110. For example, the host system 120 can write data to the memory sub-system 110 and read data from the memory sub-system 110.

The host system 120 can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface 121. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface 121 include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface 121 can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface 121 can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative- and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM) (or another resistance memory device), magneto random access memory (MRAM), negative- or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or another suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 may not include the controller 115, and can instead rely upon external control (e.g., provided by an external host, or by a processor or controller separate from the memory sub-system 110).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface 121. The host interface circuitry can convert the commands received from the host system 120 into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112A to 112N.

The memory sub-system 110 includes a media manager 113 that can manage the memory components 112A to 112N. In some embodiments, the controller 115 includes at least a portion of the media manager 113. For example, the controller 115 can include a processor 117 (processing device) configured to execute instructions stored in local memory 119 for performing the operations described herein. In some embodiments, the media manager 113 is part of the host system 120, an application, or an operating system.

As noted above, the memory components 112A to 112N can be resistance memory components such that each of the memory cells that make up the memory components 112A to 112N is a resistance memory cell. For example, each memory components 112A to 112N can represent a die providing three-dimensional phase change material and switching (PCMS) memory. In such an embodiment, each of the memory cells of the memory components 112A to 112N is a phase change memory cell.

A phase change memory cell (e.g., in a memory component 112A to 112N) can be constructed over a substrate, having a variable resistance material formed between a bottom electrode and a top electrode. One type of variable resistance material can be amorphous silicon doped with V, Co, Ni, Pd, Fe and Mn. Another type of variable resistance material can include perovskite materials such as Pr(1-x)CaxMnO3 (PCMO), La(1-xCaxMnO3(LCMO), LaSrMnO3 (LSMO), or GdBaCoxOy (GBCO). Still another type of variable resistance material can be a doped chalcogenide glass of the formula AxBy, where B is selected from among S, Se and Te and mixtures thereof, and where A includes at least one element from Group III-A (B, Al, Ga, In, Tl), Group IV-A (C, Si, Ge, Sn, Pb), Group V-A (N, P, As, Sb, Bi), or Group VII-A (F, Cl, Br, I, At) of the periodic table, and with the dopant being selected from among the noble metals and transition metals, including Ag, Au, Pt, Cu, Cd, Ir, Ru, Co, Cr, Mn or Ni. Yet another type of variable resistance material includes a carbon-polymer film comprising carbon black particulates or graphite, for example, mixed into a plastic polymer. The material used to form bottom and top electrodes of phase change memory cells can be selected from a variety of conductive materials, such as tungsten, nickel, tantalum, titanium, titanium nitride, aluminum, platinum, or silver, among others.

The variable resistance material can be in an amorphous phase or a crystalline phase. The resistance of the variable resistance material is different when in the amorphous phase in comparison to when in the crystalline phase. In particular, the variable resistance material has a higher resistivity when in the amorphous phase than when in the crystalline phase. As described herein, the phase of the variable resistance material and by extension the resistivity of the variable resistance material can be equated, linked, or otherwise associated with a binary value. In one example embodiment, the amorphous phase with a first resistivity (or first resistivity range) corresponds to a binary value of "0" or False (i.e., a reset/unset state) and the crystalline phase with a second resistivity (or second resistivity range) corresponds to a binary value of "1" or True (i.e., a set state). In other embodiments, the association between phases/resistivity of the variable resistance material and binary values can be switched/flipped.

Although variable resistance materials have been described as having only two phases (e.g., an amorphous phase and a crystalline phase), in other embodiments, variable resistance materials can have more than two phases. For example, a variable resistance material can have a single amorphous phase and two crystalline phases (e.g., cubic and hexagonal crystalline phases). For purposes of explanation, the variable resistance materials used herein will be described in relation to two phases (e.g., an amorphous phase and a crystalline phase); however, the systems, methods, and devices described herein can operate similarly when the variable resistance materials have more than two phases.

The transition from one phase to another phase (e.g., from the amorphous phase to the crystalline phase or from the crystalline phase to the amorphous phase) occurs in response to temperature changes of the variable resistance material. The temperature changes (i.e., heating and cooling) can be caused by passing differing strengths of current through the variable resistance material. For example, the electrodes of the phase change memory cell can place the variable resistance material in a crystalline phase by passing a crystallizing current through the variable resistance material, thus warming the variable resistance material to a temperature wherein a crystalline structure can grow. The electrodes can use a stronger melting current to melt the variable resistance material for subsequent cooling to the amorphous phase. When the phase change memory cell uses the crystalline phase to represent a binary value of "1" or True and the amorphous phase to represent a binary value of "0" or False, the crystallizing current can be referred to as a write or set current and the melting current can be referred to as an erase or reset current. However, as described above, the assignment of phases to binary values can be switched.

In one embodiment, the memory sub-system 110 uses the electrodes of the phase change memory cell for determining a phase of the variable resistance material and thus determine a binary value represented by the current phase of the variable resistance material. For example, the electrodes of the phase change memory cell can be coupled to a selector and the selector can act as a switch to selectively allow a variable voltage across the variable resistance material. When the resistivity of the variable resistance material is high (i.e., the variable resistance material is in an amorphous phase), the voltage used must be sufficiently high to overcome the resistivity of the variable resistance material. If the voltage is not sufficiently high, current will not pass through the variable resistance material and the selector will snap back open. In contrast, when the variable resistance material has a lower resistivity (e.g., the variable resistance material is in a crystalline phase), the same voltage that was not able to pass through the variable resistance material when at a higher resistivity (e.g., the variable resistance material is in the amorphous phase) will pass through the variable resistance material without snapping the selector back open (i.e., the selector remains closed). Thus, applying a current with a specific voltage allows the phase of the variable resistance material to be determined such that data stored in or represented by the variable resistance material can be read.

Although the variable resistance material of a phase change memory cell is described above as being in one phase or another (e.g., metastable in an amorphous phase or a crystalline phase) and having a discrete resistivity while in that corresponding phase, the resistivity of the variable resistance material can be in constant transition or can be constantly drifting. Namely, the resistivity of the variable resistance material can vary (i.e., decelerate) over time as it attempts to settle. The rate of the change is highest when the variable resistance material is initially written to a particular phase and the rate of change is reduced over time until a constant rate of resistivity change is reached (e.g., after the passage of a few hundred seconds). The rate of resistivity change can be dependent on the phase of the variable resistance material. For example, when the variable resistance material of a phase change memory cell is in the crystalline phase (i.e., the phase change memory cell is set) the rate of resistivity change can be higher than when the variable resistance material is in the amorphous phase (i.e., the phase change memory cell is reset/unset).

Accordingly, the voltage applied by a selector of the phase change memory cell may need to be time-dependent (i.e., relative to the time from when the phase change memory cell was last written) to allow the phase of the variable resistance material to be determined while the resistivity of the variable resistance material is drifting. For example, three different voltage levels can be used to determine/read the phase of the variable resistance material, where each voltage level corresponds to a different time frame from when the variable resistance material was last written. A first voltage level can correspond to the time immediately after the variable resistance material was last written (i.e., time zero) until one-hundred seconds has elapsed, a second voltage level can correspond to one-hundred seconds until twelve hours has elapsed, and a third voltage level can correspond to twelve hours and onward. The time ranges/periods can be different than the examples set forth in this document and/or can be adjusted. In some embodiments, the lowest voltage level is used initially to reduce the probability that a read operation will affect the phase of the variable resistance material. In particular, as noted above, the variable resistance material can be coupled to a selector that is itself made from phase change material. Accordingly, the selector drifts in a similar fashion as the coupled variable resistance material. Increasing voltages with time is required to reach the threshold of this selector. However, increasing voltages also increases the current going through the variable resistance material and thus the amount of heat the variable resistance material receives. With a high enough voltage and with repetition, this can alter the state of the variable resistance material. The altered state can have a resistance that is indistinguishable as set or reset. As a result, a gentle approach is taken in which re-reads are performed with elevated voltages. If the controller 115 detects a valid codeword based on reading a set of phase change memory cells (e.g., utilizing a decoder and parity bits stored in the set of phase change memory cells), re-reads of the phase change memory cells with other voltage levels are not necessary. However, if a valid codeword is not determined, the next lowest/higher voltage level is utilized. This pattern continues until either a valid codeword is determined (utilizing parity bits were appropriate) or the voltage levels are exhausted without producing a valid codeword.

As noted above, although the phase of the variable resistance material of the phase change memory cell is metastable, the resistivity of the variable resistance material changes with time (i.e., the variable resistance material becomes more resistive). This change is more dramatic when the variable resistance material is in the crystalline phase (i.e., the variable resistance material is set) than when the variable resistance material is in the amorphous phase. Thus, the gap between the resistivities of the two phases/states is widening.

Based on the unequal changing resistivity of the variable resistance material when in the amorphous and crystalline phases, determining a demarcation voltage (i.e., the voltage applied to a phase change memory cell to determine the state of the phase change memory cell) for reading the phase change memory cell is difficult and can be prone to error. This issue is particularly prevalent just after a phase change memory cell has been written (e.g., zero to one-hundred milliseconds after the phase of the variable resistance material has been altered) as the resistivity of the variable resistance material is at its highest level of transition/drift. As time elapses from the time the phase change memory cell was written, using a defined demarcation voltage is less prone to producing a read error.

To address the above issues, a set of data structures can be used for buffering/caching/storing user data that was recently written to phase change memory cells of the memory components 112A to 112N and/or parity bits associated with the user data. In some systems, a drift buffer with corresponding drift content-addressable memory (CAM) is used, which are separate from a media manager cache and corresponding media manager cache CAM. In these systems, as read and write memory requests are received by the memory sub-system 110, these requests are stored in the media manager cache with a corresponding entry in the media manager cache CAM. Prior to writing user data to the memory components 112A to 112N based on write requests stored in the media manager cache, memory requests access the user data from the media manager cache. Upon eviction from the media manager cache and the media manager cache CAM, user data from an evicted write request is written to the memory components 112A to 112N and entries are added to the drift buffer and drift CAM. Accordingly, the user data is moved from the media manager cache to the drift buffer. In this configuration, user data in the drift buffer is read instead of reading the user data directly from the memory components 112A to 112N while the corresponding phase change memory cells of the memory components 112A to 112N are still undergoing drift (e.g., during the first one-hundred milliseconds since writing the user data to the memory components 112A to 112N). As described above, in this conventional technique, two separate storage spaces are used (e.g., the media manager cache and the drift buffer) for storing user data corresponding to write requests during different periods of time. Use of these two separate storage spaces results in considerable overhead in both the physical presence of two separate storage spaces in the controller 115 and the transfers of user data between the two storage spaces (e.g., transfer of user data from the media manager cache to the drift buffer upon eviction from the media manager cache and the media manager cache CAM).

Figure 2:
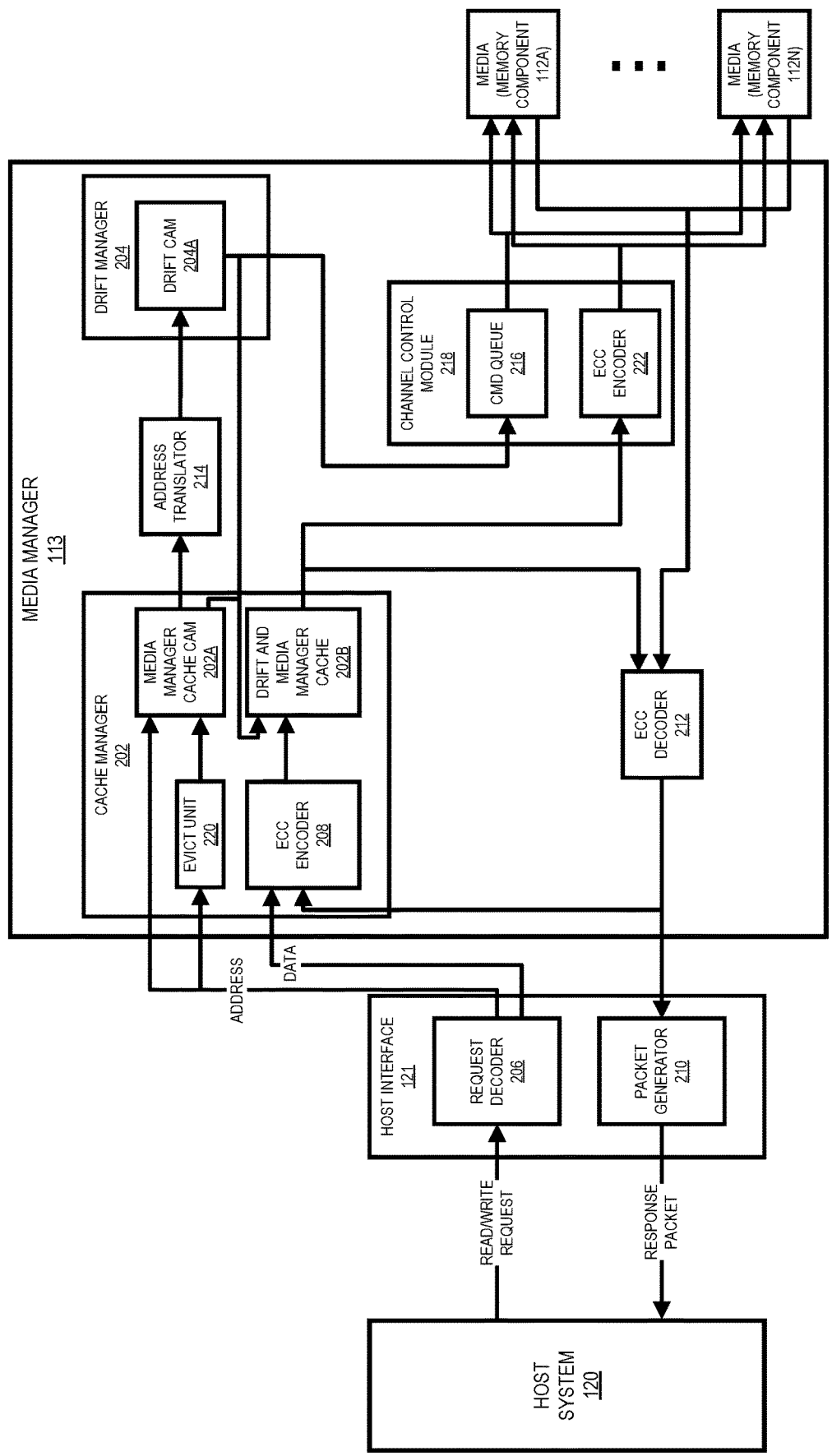
FIG. 2 presents a media manager, that includes (1) a cache manager with a media manager cache content-addressable memory (CAM) and a drift and media manager cache, and (2) a drift manager, which includes a drift CAM, in accordance with some embodiments of the present disclosure.

FIG. 2 presents a media manager 113 to address the above issues. The media manager 113 can include (1) a cache manager 202 with a media manager cache CAM 202A and a drift and media manager cache 202B, and (2) a drift manager 204 with a drift CAM 204A. Each of the media manager cache CAM 202A, the drift and media manager cache 202B, and the drift CAM 204A are stored in a memory location separate from the memory components 112A to 112N. In one embodiment, one or more of the media manager cache CAM 202A, the drift and media manager cache 202B, and the drift CAM 204A is implemented within local memory 119. In this configuration, as read and write requests are received by the media manager 113 from a host system 120 and upon determining a miss in the media manager cache CAM 202A (i.e., the absence of an entry in the media manager cache CAM 202A corresponding to the request of the host system 120), the cache manager 202 creates corresponding entries in the media manager cache CAM 202A and the drift and media manager cache 202B. In particular, an entry in the media manager cache CAM 202A includes a pointer to a location in the drift and media manager cache 202B, which contains user data. As entries corresponding to write requests are evicted from the media manager cache CAM 202A and corresponding pieces of user data are written to the memory components 112A to 112N, entries are added to the drift CAM 204A. These entries in the drift CAM 204A include pointers or other references to entries in the drift and media manager cache 202B. In particular, a pointer of an evicted entry from the media manager cache CAM 202A is used as a pointer for a corresponding entry in the drift CAM 204A. In this fashion, the user data in the drift and media manager cache 202B is not moved and remains in the drift and media manager cache 202B until the corresponding entry in the drift CAM 204A is removed (i.e., one-hundred milliseconds after user data being written to the memory components 112A to 112N). After the corresponding entry is removed from the drift CAM 204A, no entry in either the media manager cache CAM 202A or the drift CAM 204A points to or otherwise references the entry in the drift and media manager cache 202B. Accordingly, this unused entry in the drift and media manager cache 202B can be overwritten by a subsequent read or write request, which is referenced by either the media manager cache CAM 202A or the drift CAM 204A.

As noted above, the media manager cache CAM 202A handles read and write requests from host system 120. In contrast, the drift CAM 204A handles write requests during a resistivity drift period, corresponding to the time period after a write to the memory components 112A to 112N during which reading user data from the memory components 112A to 112N is difficult due to resistivity drift issues. Accordingly, the media manager cache CAM 202A and the drift CAM 204A are each sized to handle the potential number of read and/or write requests that can be received by the media manager 113 (e.g., the drift CAM 204A is sized to handle a maximum number of writes to the memory components 112A to 112N that potentially can occur during a resistivity drift period (e.g., a maximum number of writes to the memory components 112A to 112N during a one-hundred millisecond period)). Further, the drift and media manager cache 202B is sized to accommodate user data for both the media manager cache CAM 202A and the drift CAM 204A (e.g., the number of user data entries in the drift and media manager cache 202B is at least equal to the sum of the number of entries in the media manager cache CAM 202A and the drift CAM 204A).

Figure 3A:
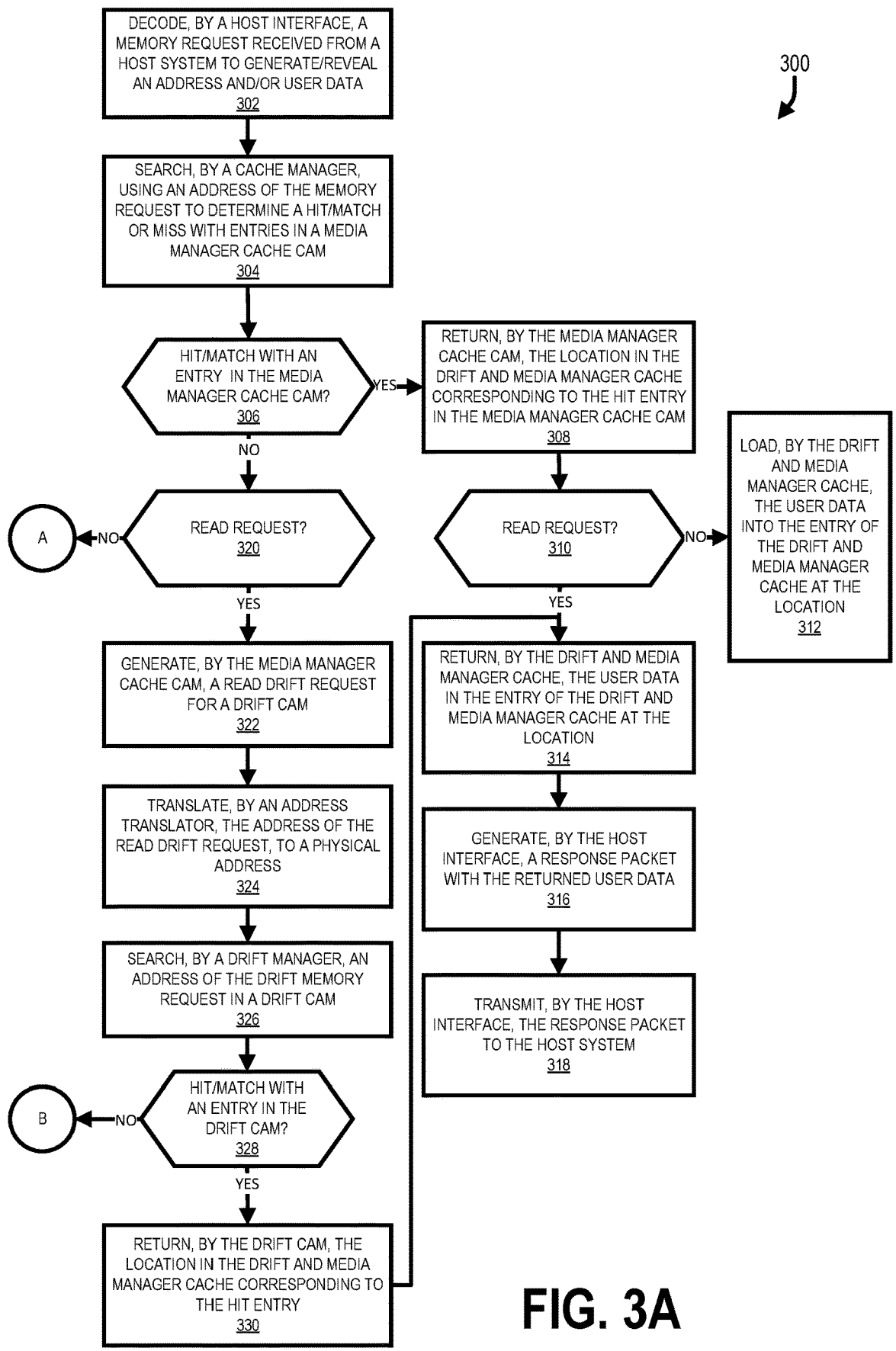
FIGS. 3A-3C present a flow diagram of an example method to cache read and write requests while accounting for a phase change memory cell drift phenomenon, in accordance with some embodiments of the present disclosure.
Figure 3B:
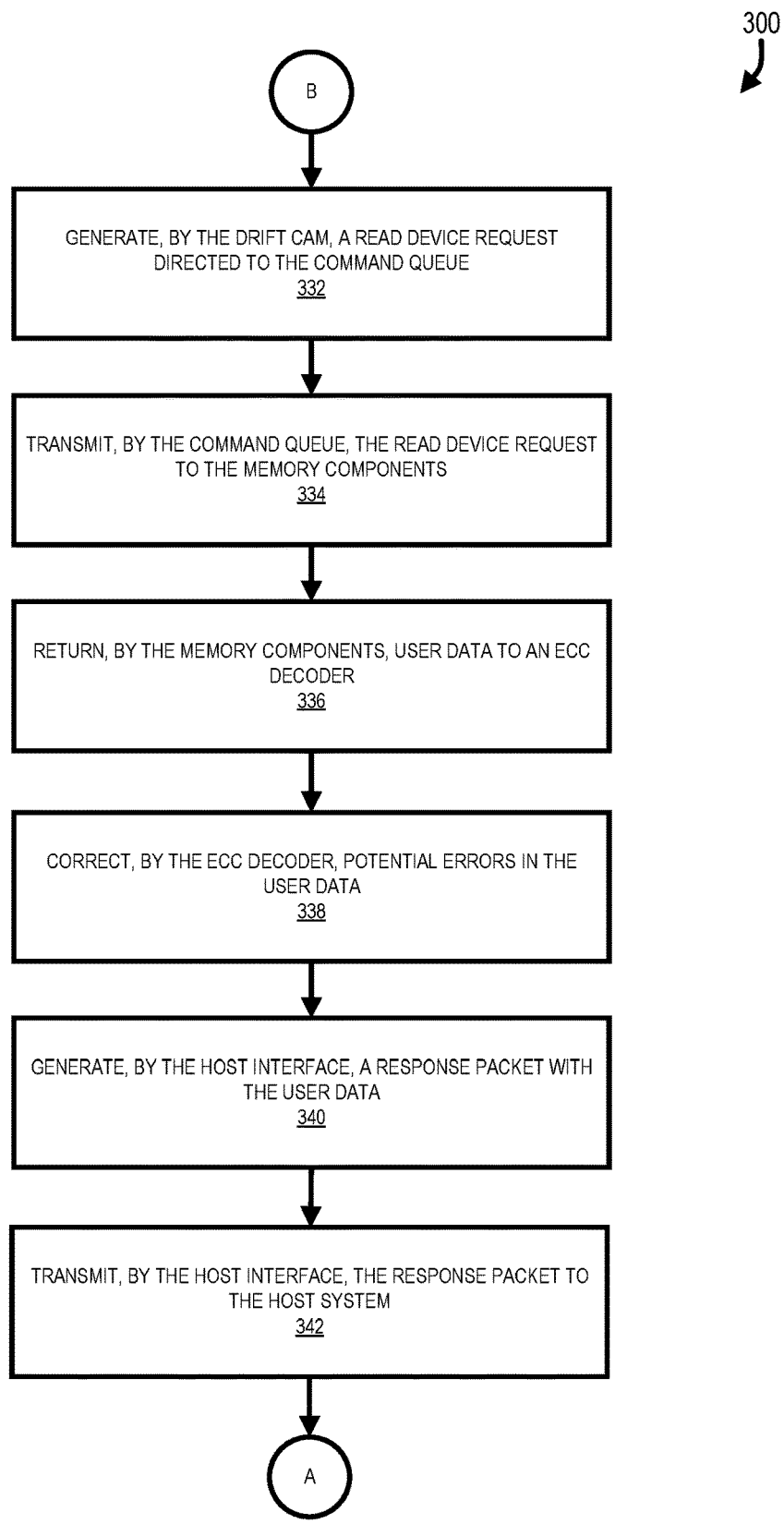
Figure 3C:
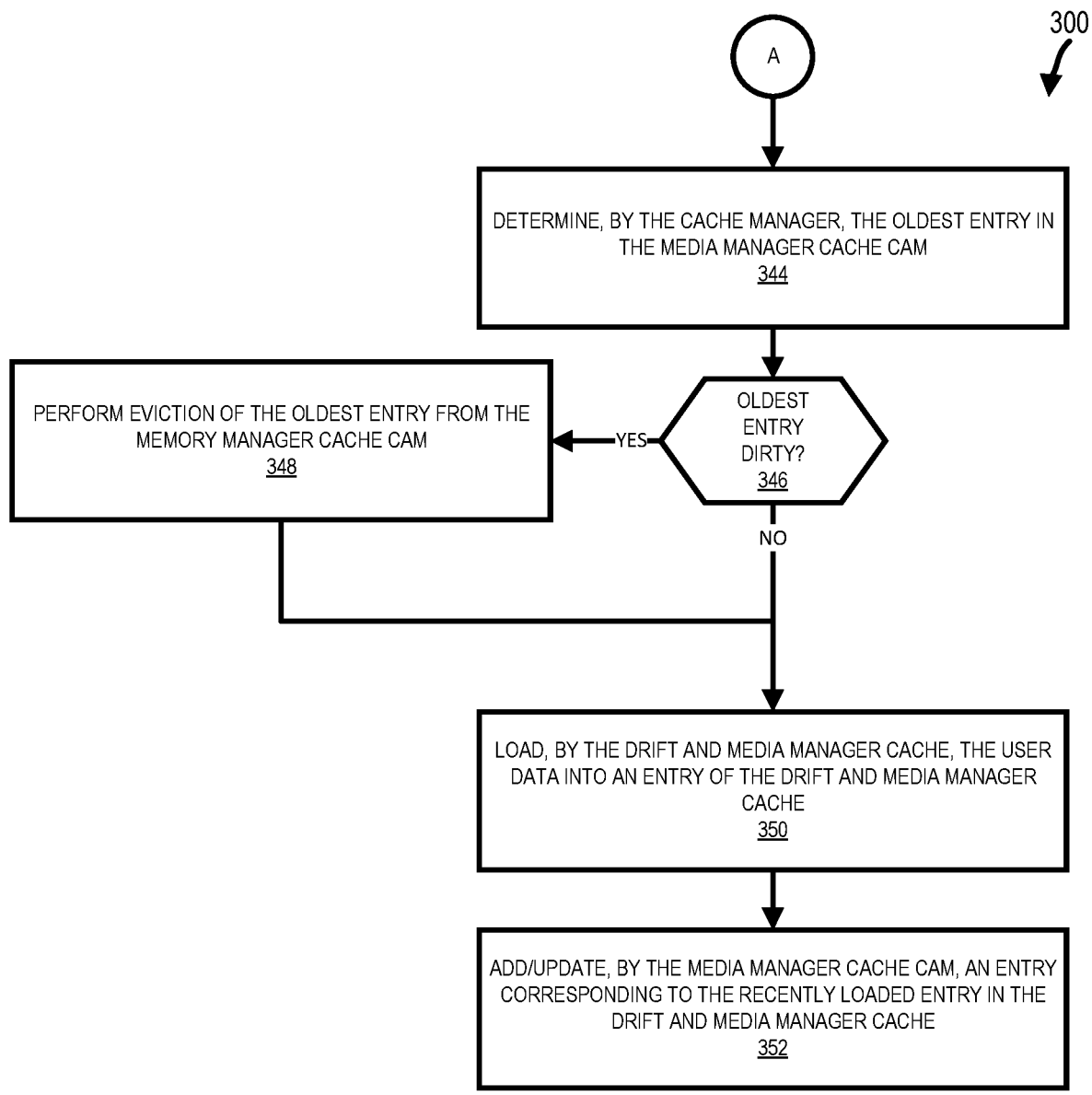

The media manager 113 and other components of FIG. 2 will now be described below in reference to the method 300 of FIGS. 3A-3C. FIGS. 3A-3C present a flow diagram of an example method 300 to cache read and write requests while accounting for a phase change memory cell drift phenomenon, in accordance with some embodiments of the present disclosure. In particular, the method 300 allows for the same cache (i.e., drift and media manager cache 202B) to temporarily store both (1) user data to assist with read requests after corresponding recent writes to phase change memory cells of the memory components 112A to 112N and (2) recent read and write requests. In this configuration, user data corresponding to requests are stored in a single cache (i.e., the drift and media manager cache 202B) to reduce overhead related to the increased footprint and eliminate unnecessary movement of user data between multiple storage spaces (e.g., the cache 202B and a drift cache). The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the media manager 113 of FIG. 1 and FIG. 2.

Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As shown in FIG. 3A, the method 300 commences at operation 302 with the request decoder 206 of the host interface 121 decoding a memory request received from a host system 120. Decoding the received memory request by the request decoder 206 can include revealing/producing one or more of an address and user data of the memory request. For example, the received memory request that is decoded by the request decoder 206 can either be a read memory request or a write memory request. When the received memory request is a read memory request, decoding the memory request by the request decoder 206 at operation 302 includes producing a memory address corresponding to a portion of memory (e.g., a location in the memory components 112A to 112N) from which the host system 120 requests user data to be read/returned. When the received memory request is a write memory request, decoding the received memory request by the request decoder 206 at operation 302 includes producing a memory address and user data. The memory address associated with the write memory request corresponds to a portion of memory (e.g., a location in the memory components 112A to 112N) to which the user data is to be written. The address encoded in either the read memory request or the write memory request and decoded by the request decoder 206 can be a logical address (e.g., a logical block address) or a physical address of a location in the memory components 112A to 112N (e.g., a physical block address). As described herein for purposes of illustration, the address provided in the received memory request and decoded by the request decoder 206 at operation 302 is a logical address that will be translated to a physical address before writing to or reading from the memory components 112A to 112N.

Figure 4:
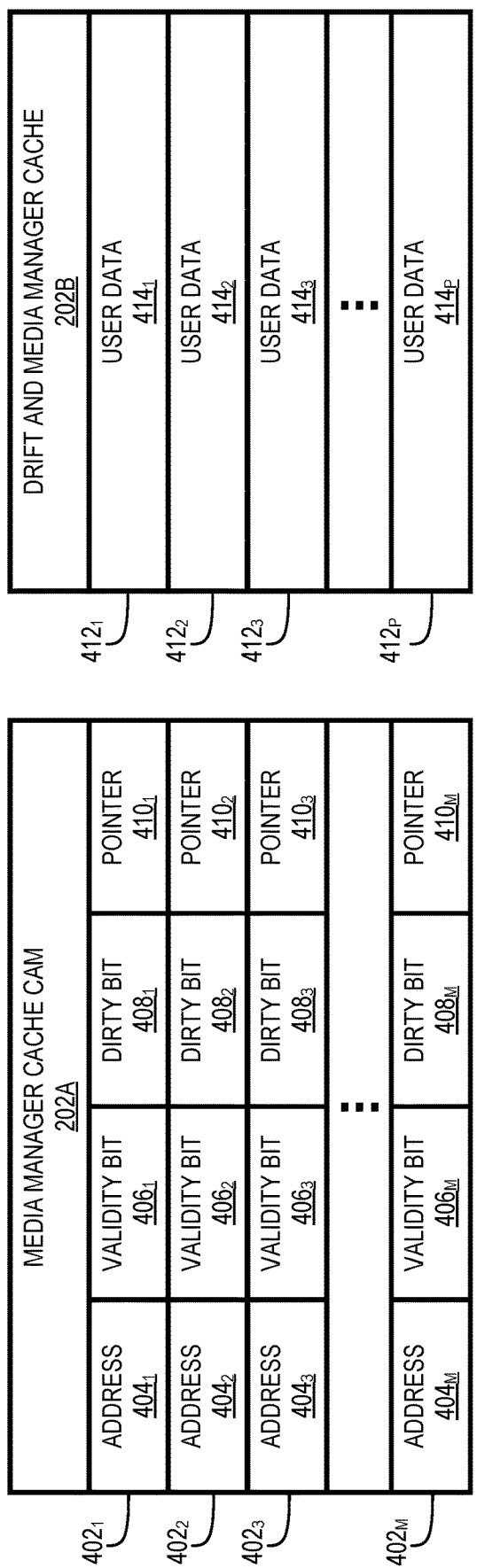
FIG. 4 shows an example of the media manager cache CAM and the drift and media manager cache, in accordance with some embodiments of the present disclosure.

At operation 304, the cache manager 202 searches to determine whether an entry is present within the media manager cache CAM 202A that includes the address decoded at operation 302. FIG. 4 shows an example of the media manager cache CAM 202A and the drift and media manager cache 202B according to one example embodiment. As shown in FIG. 4, the media manager cache CAM 202A includes a set of entries $402_1$-$402_M$ that are each comprised of an address 404, a validity bit 406, a dirty bit 408, and a pointer 410. As also shown in FIG. 4, the drift and media manager cache 202B includes a set of entries 412$_1$-412$_P$ that are each comprised of user data 414. In this example embodiment, the pointers 410 of the entries 402 point/reference entries 412 in the drift and media manager cache 202B. In particular, the pointer 410 can include a number or another reference to a location of an entry 402 within the drift and media manager cache 202B. At operation 304, the cache manager 202 can search to determine if an entry 402 in the media manager cache CAM 202A includes the address decoded at operation 302 (e.g., an address 404 in an entry 402 is identical/matches or otherwise corresponds to the address decoded at operation 302).

At operation 306, the cache manager 202 can determine whether there was a hit/match in the media manager cache CAM 202A based on the search performed at operation 304. In response to a hit/match, the method 300 moves to operation 308. At operation 308, the media manager cache CAM 202A returns a location in the drift and media manager cache 202B corresponding to the hit/matched address and consequently corresponding to the hit/matching entry 402 in the media manager cache CAM 202A. In particular, the pointer 410 in the hit/matching entry 402 in the media manager cache CAM 202A indicates an entry 412 in the drift and media manager cache 202B. The media manager cache CAM 202A returns the pointer 410 of the matching/hit entry 402 at operation 308.

At operation 310, cache manager 202 determines whether the received memory request decoded at operation 302 is a read memory request or a write memory request. When the received memory request is not a read request (i.e., is a write request), the method 300 moves to operation 312. At operation 312, the drift and media manager cache 202B loads the user data decoded at operation 302 to the location returned at operation 308. In particular, the location returned at operation 308 corresponds to an entry 412 in the drift and media manager cache 202B. Accordingly, the drift and media manager cache 202B loads the user data decoded at operation 302 to the user data 414 field of the entry 412. Loading the user data decoded at operation 302 to the user data 414 field of an entry 412 includes the media manager cache CAM 202A indicating that the entry 402 is invalid, using the validity bit 406, during the period of time that the user data is being loaded into the entry 412 (e.g., the validity bit 406 is set to a value of "0" at or prior to commencement of loading the user data into the entry 412 and is set to a value of "1" following the successful loading of the user data into the entry 412). Further, the media manager cache CAM 202A marks the entry 402 as dirty using the dirty bit 408 (e.g., the dirty bit 408 has a value of "1" when the entry 412 is dirty (i.e., the user data 414 in a corresponding entry 412 of the drift and media manager cache 202B has not been written to the memory components 112A to 112N)). In some embodiments, loading user data 414 to the drift and media manager cache 202B includes error correcting code (ECC) encoding using the ECC encoder 208 such that the user data 414 includes ECC bits for later correction of errors presented during storage of the user data 414.

In contrast, when the cache manager 202 determines at operation 310 that the received memory request of operation 302 is a read memory request, the method 300 moves to operation 314. At operation 314, the drift and media manager cache 202B can return the user data 414 at the entry 412 located at operation 308 to a packet generator 210 of the host interface 121. In particular, at operation 314, the drift and media manager cache 202B returns the user data 414 of the entry 412 at the location indicated at operation 308 to the packet generator 210. In some embodiments, returning of the user data 414 is performed in conjunction with ECC decoding using the ECC decoder 212 based on parity bits stored along with the user data 414 in the drift and media manager cache 202B.

At operation 316, the packet generator 210 of the host interface 121 generates a response packet for transmission to the host system 120 from which the original memory request decoded by the request decoder 206 at operation 302 was received. The response packet includes the user data 414 returned by the drift and media manager cache 202B and, if applicable, corrected by the ECC decoder 212 at operation 314.

At operation 318, the host interface 121 transmits the response packet generated at operation 316 to the host system 120 from which the original memory request from operation 302 (i.e., a read memory request) was received. Accordingly, the read memory request from the host system 120 is fulfilled based on user data 414 stored in the drift and media manager request cache 202B and referenced by an entry 402 in the media manager cache CAM 202A.

Returning to operation 306, when the media manager cache CAM 202A does not detect a hit in the media manager cache CAM 202A (i.e., the decoded address of operation 302 does not match or otherwise correspond to an address 404 of any of the entries 402 of the media manager cache CAM 202A), the method 300 moves to operation 320 for the cache manager 202 to determine whether the received memory request decoded at operation 302 is a read memory request or a write memory request (similar to operation 310). When the received memory request decoded at operation 302 is not a read memory request (e.g., a write memory request), the method 300 proceeds via off page connector A (described with reference to FIG. 3C). When the received memory request decoded at operation 302 is a read memory request, the method 300 moves to operation 322.

At operation 322, the media manager cache CAM 202A generates a read drift request that is targeted at the drift CAM 204A. In particular, the read drift request includes the address decoded from the original memory request of operation 302 (i.e., a logical address) and the media manager cache CAM 202A transmits the read drift request towards the drift CAM 204A.

At operation 324, the address translator 214 translates the logical address of the read drift request generated at operation 322 into a physical address. While the logical address of the original memory request decoded at operation 302 and the read drift request of operation 322 corresponds to an address space of the host system 120, the physical address produced at operation 324 corresponds to an address space of the memory components 112A to 112N.

At operation 326, the drift manager 204 searches the drift CAM 204A to determine whether an address of an entry in the drift CAM 204A matches or otherwise corresponds to the address of the read drift request generated/translated at operation 324. FIG. 5 shows an example of the drift CAM 204A according to one example embodiment. As shown in FIG. 5, the drift CAM 204A includes a set of entries 502$_1$-502$_Q$ that are each comprised of an address 504, a validity bit 506, and a pointer 508. At operation 328, in response to the drift manager 204 determining that an entry 502 in the drift CAM 204A matches or otherwise corresponds to the address of the read drift request translated at operation 324, the method 300 moves to operation 330.

At operation 330, the drift CAM 204A returns a reference to a location in the drift and media manager cache 202B that corresponds to the hit/matching entry 502 in the drift CAM 204A. In one embodiment, the reference to the location in the drift and media manager cache 202B is the pointer 508 of the hit/matching entry 502. The method 300 can thereafter move to operation 314. As noted above, at operation 314 the drift and media manager cache 202B returns the user data 414 at the entry 412 corresponding to the location indicated by the pointer 508 of the hit/matching entry 502 to a packet generator 210 of the host interface 121. Subsequently, the packet generator 210 generates a response packet at operation 316 for transmission to the host system 120 at operation 318.

Returning to operation 328, in response to determining that no entry 502 in the drift CAM 204A matches or otherwise corresponds to the address of the read drift request translated at operation 324, the method 300 moves, via off page connector B, to operation 332 as shown in FIG. 3B. At operation 332, the drift CAM 204A generates a read device request directed to the command queue 216 of the channel control module 218. The read device request retrieves user data from the memory components 112A to 112N based on the translated address generated at operation 324 (e.g., a physical block address).

At operation 334, the command queue 216 transmits the read device request to the memory components 112A to 112N. As noted above, the read device request includes the translated address generated at operation 324, which is a physical address to a portion of the memory components 112A to 112N.

At operation 336, the memory components 112A to 112N return the user data located at the address of the read device request. The user data can be of any size (e.g., any number of bits) and can represent any type of data (e.g., video data, image data, audio data, etc.). As shown in FIG. 2, the memory components 112A to 112N returns the user data to the ECC decoder 212 such that error correction can be performed on the user data at operation 338 based on potential errors introduced to the user data while stored in the memory component 112A to 112N.

At operation 340, the packet generator 210 of the host interface 121 generates a response packet for transmission to the host system 120 from which the original request from operation 302 was received. The response packet includes the user data returned by the memory component 112A to 112N at operation 336 and corrected by the ECC decoder 212 at operation 338.

At operation 342, the host interface 121 transmits the response packet generated at operation 340 to the host system 120 from which the original memory request from operation 302 (i.e., a read memory request) was received. Accordingly, the read memory request from the host system 120 is fulfilled based on user data stored in the memory components 112A to 112N.

Subsequent to operation 342 or simultaneous with one or more of the preceding operations (e.g., during an overlapping time period with the operations 338, 340, and/or 342), the method 300 can move, via off page connector A, to operation 344 to begin adding the fulfilled memory request to the media manager cache CAM 202A and the drift and media manager cache 202B such that user data 414 can be later potentially accessed by subsequent memory requests from the drift and media manager cache 202B. As shown in FIG. 2, the user data 414 read from the memory components 112A to 112N are read decoded by the ECC decoder 212 to correct for errors introduced while the user data 414 was stored in the memory components 112A to 112N. Thereafter, the corrected user data 414 may be processed by the ECC encoder 208 prior to storage in the drift and media manager cache 202B. Accordingly, the user data 414 stored in the drift and media manager cache 202B includes parity bits for possible future error correction.

At operation 344, the media manager 202 searches or otherwise determines the oldest entry 402 in the media manager cache CAM 202A. For example, the oldest entry 402 can be the entry 402 that was earliest written to and/or updated in the media manager cache CAM 202A.

At operation 346, the cache manager 202 determines if the oldest entry 402 determined at operation 344 is dirty (e.g., the user data 414 of an entry 412 in the drift and media manager cache 202B corresponding to the entry 402 has not yet been written to the memory components 112A to 112N). In one embodiment, the cache manager 202 determines if the oldest entry 402 is dirty based on the dirty bit 408 of the oldest entry 402 (e.g., when the dirty bit 408 of the oldest entry 402 has a value of "1", the corresponding user data 414 in the drift and media manager cache 202B has not yet been written to the memory components 112A to 112N and when the dirty bit 408 of the entry 402 has a value of "0", the corresponding user data 414 in the drift and media manager cache 202B has been written to the memory components 112A to 112N).

When the cache manager 202 determines at operation 346 that user data 414 corresponding to the oldest entry 402 is dirty, the method 300 moves to operation 348 to evict the entry 402 from the media manager cache CAM 202A and write the user data 414 of the corresponding entry 412 in the drift and media manager cache 202B to the memory components 112A to 112N. The eviction can be instigated and/or performed by the evict unit 220. As will be discussed below, this eviction and writing of user data 414 to the memory components 112A to 112N results in a corresponding entry 502 in the drift CAM 204A, which references/points to an entry 412 in the drift and media manager cache 202B such that the subsequent read memory requests can read the user data 414 from the drift and media manager cache 202B instead of the memory components 112A to 112N to avoid issues with phase change memory cell resistivity drift. As will be described below, since the corresponding entry 412 in the drift and media manager cache 202B will still be in use by the drift CAM 204A, another entry 412 in the drift and media manager cache 202B is used by operations 350 and 352 for loading user data for the memory request decoded at operation 302.

Returning to operation 346, when the cache manager 202 determines that user data 414 corresponding to the oldest entry 402 is not dirty, the method 300 moves to operation 350. At operation 350, the drift and media manager cache 202B loads user data from the memory request decoded at operation 302 to an entry 412 (e.g., the drift and media manager cache 202B loads user data from the memory request into the user data 414 field of the oldest entry 412, which corresponds to the oldest entry in the media manager cache CAM 202A). Accordingly, the user data of the memory request replaces the oldest entry 412.

At operation 352, the media manager cache CAM 202A adds an entry 402 corresponding to the entry 412 from operation 350, which that now includes user data from the memory request decoded at operation 302. In particular, the oldest entry 402 in the media manager cache CAM 202A can be updated based on the loaded user data in the drift and media manager cache 202B. For example, while the user data is being loaded into an entry 412 of the drift and media manager cache 202B, the validity bit 406 of the entry 402 updated in the media manager cache CAM 202A can be set to "0" and upon completion of the loading at operation 350, the validity bit 406 can be set to "1" to indicate that the entry 402 and the entry 412 are now valid. Further, a dirty bit 408 of the entry 402 updated in the media manager cache CAM 202A can be set to indicate whether the user data 414 written to the drift and media manager cache 202B at operation 350 has been written to the memory components 112A to 112N (i.e., the dirty bit 408 is set to "0" to indicate that the user data 414 is not dirty, corresponding to a read memory request) or has not been written to the memory components 112A to 112N (i.e., the dirty bit 408 is set to "1" to indicate that the user data 414 is dirty, corresponding to a write memory request).

As shown in FIG. 3C, the operations 344-352 can also be performed upon the cache manager 202 determining at operation 320 that the memory request decoded at operation 302 is not a read memory request (i.e., the memory request decoded at operation 302 is a write memory request).

Returning to operation 346, when a replacement of an entry 402 in the media manager cache CAM 202A and the drift and media manager cache 202B is not possible (i.e., the oldest entry 402 in the media manager cache CAM 202A indicates that the corresponding entry 412 in the drift and media manager cache 202B is dirty), the oldest entry 402 is evicted from the media manager cache CAM 202A at operation 348. However, since the corresponding entry 412 in the drift and media manager cache 202B will still be in use by the drift CAM 204A, another entry 412 in the drift and media manager cache 202B is used by operations 350 and 352 for loading user data for the memory request decoded at operation 302. For example, since the drift CAM 204A can be sized and configured to handle user data for a resistivity drift period, corresponding to the time period after a write to the memory components 112A to 112N during which reading user data from the memory components 112A to 112N is difficult due to resistivity drift issues, entries 412 in the drift and media manager cache 202B can be periodically be freed. In this example, these freed entries 412 that are no longer referenced by the drift CAM 204A can be used for storing user data for the current memory request.

Figure 6:
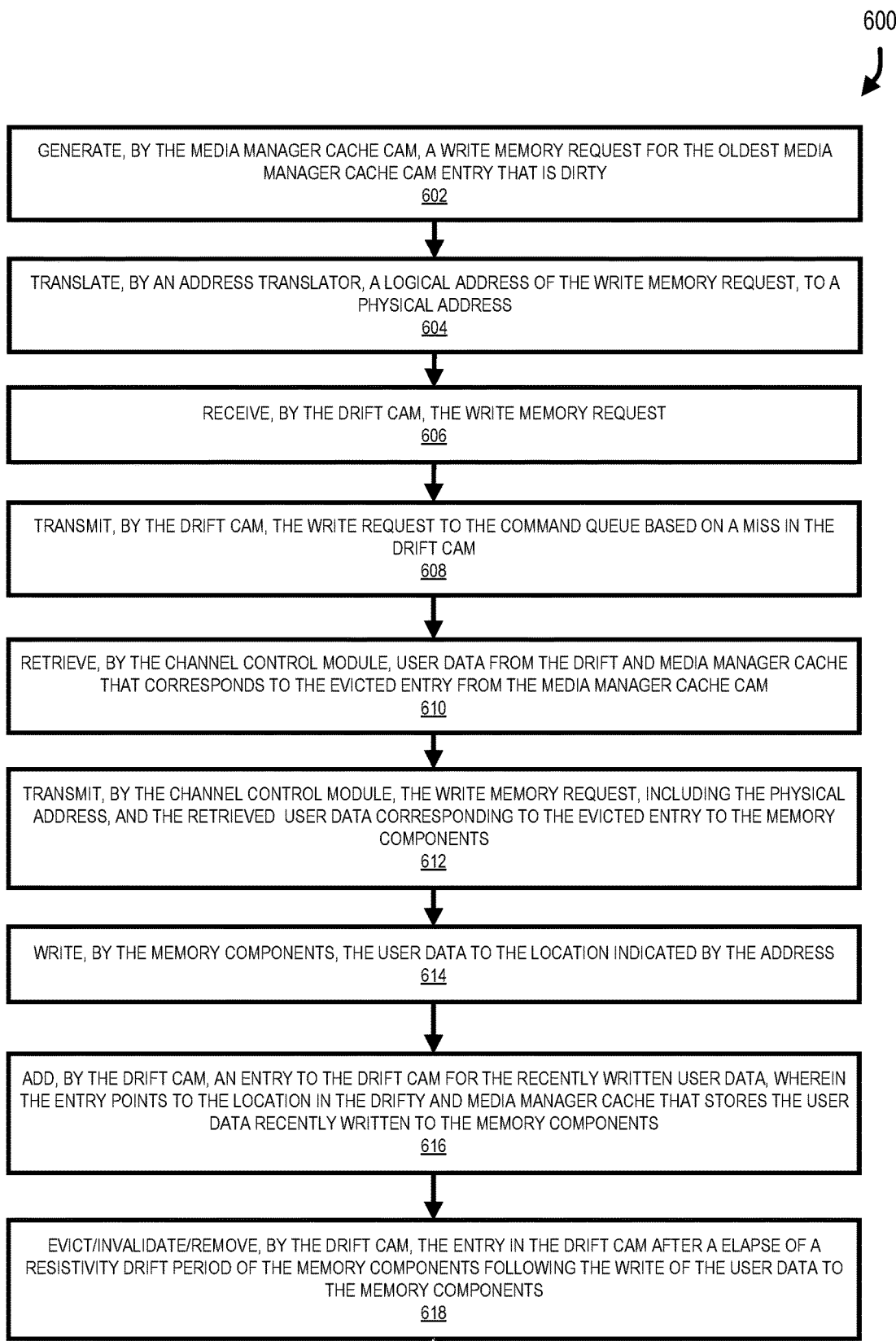
FIG. 6 presents a flow diagram of an example method for evicting an entry from the media manager cache CAM, in accordance with some embodiments of the present disclosure.

FIG. 6 presents a flow diagram of an example method 600 for evicting an entry from the media manager cache CAM 202A according to one example embodiment. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the media manager 113 of FIG. 1 and, in particular, by the evict unit 220.

The method 600 commences at operation 602 with the media manager cache CAM 202A generating a write memory request. The write memory request includes the logical address 404 of the oldest entry 402 in the media manager cache CAM 202A. As described in relation to operation 346 of the method 300, the eviction method 600 is performed when the oldest entry 402 in the media manager cache CAM 202A is dirty (i.e., the dirty bit 408 of the oldest entry 402 is set to the value "1").

At operation 604, the address translator 214 translates the logical address of the write memory request generated at operation 602 into a physical address. In particular, while the logical address stored in the address 404 field of the oldest entry 402 corresponds to an address space of the host system 120, the physical address produced at operation 604 corresponds to an address space of the memory components 112A to 112N such that a write of user data can be properly addressed to the memory components 112A to 112N.

At operation 606, the drift CAM 204A receives the write memory request from the address translator 214. As noted above, the write memory request includes the physical address generated by the address translator 214 at operation 604. Since the write memory request corresponds to an entry 402 that was evicted from the media manager cache CAM 202A, corresponding user data 414 from the drift and media manager cache 202B has not been written to the memory components 112A to 112N. Thus, the drift CAM 204A does not include an entry 502 for the user data 414 associated with the recently evicted entry 402 as the entries 502 in the drift CAM 204A correspond to recent writes to the memory components 112A to 112N (e.g., writes within the last one-hundred milliseconds).

At operation 608, the drift CAM 204A transmits/forwards the write memory request to the command queue 216. In one embodiment, the drift CAM 204A forwards the write memory request to the command queue 216 in response to a miss in the drift CAM 204A. The command queue 216 can hold the write memory request before transmitting/forwarding to the memory components 112A to 112N. In particular, the command queue 216 of the channel control module 218 receives the address 404 included in the write memory request from the drift CAM 204A and waits for the ECC encoder 222 of the channel control module 218 to obtain user data 414 from the drift and media manager cache 202B at operation 610. For example, in one embodiment, the ECC encoder 222 retrieves the user data 414 of an entry 412 in the drift and media manager cache 202B corresponding to the evicted entry 402 from the media manager cache CAM 202A, while in another embodiment the drift and media manager cache 202B transmits the user data 414 to the ECC encoder 222. Once the channel control module 218 (e.g., the command queue 216 and ECC encoder 222) has obtained both the user data 414 to be written to the memory components 112A to 112N and the address 404 (i.e., from the write memory request) where the user data 414 is to be written, the channel control module 218 forwards/transmits both to the memory components 112A to 112N at operation 612.

At operation 614, the user data 414 is written to the location in the memory components 112A to 112N corresponding to the physical address.

At operation 616, the drift CAM 204A adds an entry 502 corresponding to the user data 414 that was recently written to the memory components 112A to 112N. The pointer 508 of the added entry 502 references/points to the entry 412 in the drift and media manager cache 202B from which the user data 414 was retrieved for writing to the memory components 112A to 112N. Accordingly, although the entry 402 in the media manager cache CAM 202A no longer points/references the entry 412, the newly added entry 502 in the drift CAM 204A now references the entry 412. The entry 502 can remain in the drift CAM 204A for a specified resistivity drift period of time (e.g., one-hundred milliseconds) until being invalidated, evicted, or otherwise removed at operation 618. During this time period, memory requests for the user data 414 can be accessed from the entry 412 in the drift and media manager cache 202B based on the entry 502 in the drift CAM 204A. However, after invalidation/eviction/removal at operation 618, memory requests for the user data 414 are accessed directly from the memory components 112A to 112N.

Although described as adding the entry 502 corresponding to the user data 414 that was recently written to the memory components 112A to 112N after writing to the memory components 112A to 112N at operation 614, in some embodiments, the drift CAM 204A adds an entry 502 any time after receiving the write memory request from the address translator 214. In particular, in response to receipt of the write memory request or a determination that the drift CAM 204A does not include an entry 502 corresponding to the write memory request, operation 616 can be performed.

As described above, to reduce overhead costs associated with a media manager cache that is separate from a drift buffer, the drift buffer can be eliminated in favor of the use of pointers/references in a separate drift data structure (e.g., the drift CAM 204A) to portions in the drift and media manager cache 202B. In particular, as dirty entries 402 are evicted from the media manager cache CAM 202A, which manages/catalogs the drift and media manager cache 202B (e.g., write requests/instructions that have not yet been committed to phase change memory cells), corresponding entries 502 can be added to a drift CAM 204A together with the corresponding user data 414 being written to the phase change memory cells. The entries 502 in the drift CAM 204A reference user data 414 in the drift and media manager cache 202B. Accordingly, instead of moving and writing user data 414 to a drift buffer as performed in a some architectures, the user data 414 remains in the drift and media manager cache 202B and the drift CAM 204A includes a pointer/reference to the location of the user data 414 in the drift and media manager cache 202B. In this fashion, additional movement/writes of the user data 414 can be avoided in addition to the elimination of a separate memory structure (e.g., the elimination of the drift buffer).

Figure 7:
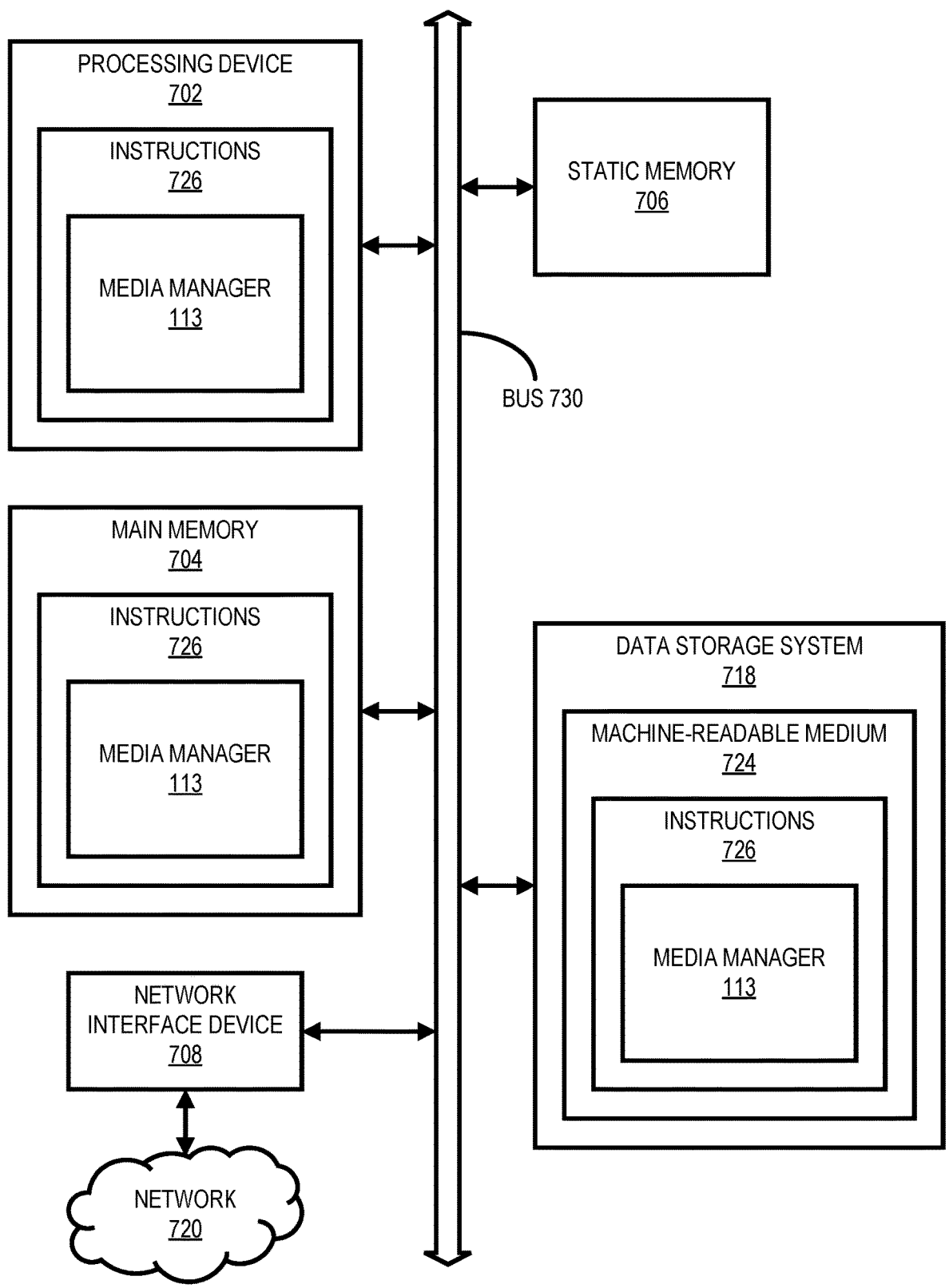
FIG. 7 is a block diagram of an example computer system in which embodiments of the present disclosure can operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the media manager 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1.

In one embodiment, the instructions 726 include instructions to implement functionality corresponding to a media manager (e.g., the media manager 113 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. For example, a computer system or other data processing system, such as the controller 115, can carry out the computer-implemented method 300, including 600 in response to its processor executing a computer program (e.g., a sequence of instructions) contained in a memory or other non-transitory machine-readable storage medium. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method to cache read and write memory requests while accounting for a phase change memory cell drift phenomenon, the method comprising:
    adding, in response to receiving a write memory request from a host system, an entry to a cache that includes user data of the write memory request, wherein the write memory request is directed to a set of phase change memory cells;
    adding, in response to receiving the write memory request, an entry in a first content-addressable memory (CAM), wherein the entry in the first CAM includes a reference to the entry in the cache that includes the user data of the write memory request;
    writing the user data of the write memory request to the set of phase change memory cells; and
    adding an entry to a second CAM, wherein the entry in the second CAM includes a reference to the entry in the cache that includes the user data of the write memory request.

2. The method of claim 1, further comprising:
    evicting the entry in the first CAM such that the entry in the cache is referenced by the second CAM but not referenced in the first CAM after the user data of the write memory request is written to the set of phase change memory cells.

3. The method of claim 1, further comprising:
    receiving a read memory request from a host system; and
    fulfilling the read memory request based on the entry in the second CAM and the entry in the cache when the read memory request is received after writing the user data to the set of phase change memory cells.

4. The method of claim 3, wherein fulfilling the read memory request based on the entry in the second CAM and the entry in the cache comprises:
    determining a miss in the first CAM based on an address of the read memory request;
    determining a hit in the second CAM based on the address of the read memory request, wherein the hit in the second CAM is based on the entry in the second CAM; and
    returning, based on the entry in the second CAM and in response to determining a hit in the second CAM, a location of the entry in the cache based on the reference in the entry in the second CAM to the entry in the cache.

5. The method of claim 3, further comprising:
    fulfilling the read memory request based on the entry in the first CAM and the entry in the cache when the read memory request is received before writing the user data to the set of phase change memory cells.

6. The method of claim 5, wherein fulfilling the read memory request based on the entry in the first CAM and the entry in the cache comprises:
    determining a hit in the first CAM based on an address of the read memory request, wherein the hit in the first CAM is based on the entry in the first CAM; and
    returning, based on the entry in the first CAM and in response to determining a hit in the first CAM, a location of the entry in the cache based on the reference in the entry in the first CAM to the entry in the cache.

7. The method of claim 5, further comprising:
    fulfilling the read memory request from the set of phase change memory cells when the read memory request is received after the entry being evicted from the second CAM.

8. The method of claim 7, wherein fulfilling the read memory request from the set of phase change memory cells comprises:
    determining a miss in the first CAM based on an address of the read memory request;
    determining a miss in the second CAM based on the address of the read memory request; and
    transmitting, in response to determining a miss in the second CAM for the address of the read memory request, a read request to the phase change memory cells based on the address of the read memory request.

9. The method of claim 3, further comprising:
evicting the entry in the second CAM following an elapse of a resistivity drift period of the set of phase change memory cells following the write of the user data to the phase change memory cells.

10. The method of claim 1, wherein the first CAM and the second CAM include a number of entries equal to or less than the number of entries in the cache.

11. A system for caching read and write memory requests while accounting for a phase change memory cell drift phenomenon, the system comprising:
a cache to include a first set of entries and each entry in the first set of entries includes user data;
a media manager cache content-addressable memory (CAM) to include a second set of entries, wherein each entry in the second set of entries includes a reference to an entry in the first set of entries; and
a drift CAM to include a third set of entries, wherein each entry in the third set of entries includes a reference to an entry in the first set of entries.

12. The system of claim 11, wherein in response to receipt of a read or write memory request from a host system (1) a first entry is added to the first set of entries of the cache and includes user data of the read or write memory request and (2) a second entry is added to the second set of entries of the media manager cache CAM, wherein the reference of the second entry added to the second set of entries is to the first entry added to the first set of entries.

13. The system of claim 12, wherein in response to eviction of the second entry from the media manager cache CAM (1) the user data from the first entry is written to a set of phase change memory cells and (2) a third entry is added to the third set of entries of the drift CAM, wherein the reference of the third entry added to the third set of entries is to the first entry.

14. The system of claim 13, wherein the third entry is evicted from the drift CAM following an elapse of a resistivity drift period of the set of phase change memory cells following the write of the user data to the phase change memory cells.

15. A system comprising:
a memory component; and
a processing device, coupled to the memory component, configured to:
add, in response to receiving a write memory request from a host system, an entry to a cache that includes user data of the write memory request, wherein the write memory request is directed to a set of phase change memory cells;
add, in response to receiving the write memory request, an entry in a first content-addressable memory (CAM), wherein the entry in the first CAM includes a reference to the entry in the cache that includes the user data of the write memory request;
write the user data of the write memory request to the set of phase change memory cells;
add an entry to a second CAM, wherein the entry in the second CAM includes a reference to the entry in the cache that includes the user data of the write memory request; and
evict the entry in the first CAM such that the entry in the cache is referenced by the second CAM.

16. The system of claim 15, wherein the entry in the cache is referenced by the second CAM but not referenced in the first CAM after the user data of the write memory request is written to the set of phase change memory cells.

17. The system of claim 15, wherein the processing device is further configured to:
receive a read memory request from a host system; and
fulfill the read memory request based on the entry in the second CAM and the entry in the cache when the read memory request is received after writing the user data to the set of phase change memory cells.

18. The system of claim 17, wherein the processing device is further configured to:
fulfill the read memory request based on the entry in the first CAM and the entry in the cache when the read memory request is received before writing the user data to the set of phase change memory cells.

19. The system of claim 17, wherein the processing device is further configured to:
evict the entry in the second CAM following an elapse of a resistivity drift period of the set of phase change memory cells following the write of the user data to the phase change memory cells.

20. The system of claim 19, wherein the processing device is further configured to:
fulfill the read memory request from the set of phase change memory cells when the read memory request is received after the entry being evicted from the second CAM.

* * * * *